United States Patent
He et al.

(10) Patent No.: US 7,299,446 B2
(45) Date of Patent: Nov. 20, 2007

(54) ENABLING EFFICIENT DESIGN REUSE IN PLATFORM ASICS

(75) Inventors: Ying Chun He, Milpitas, CA (US); Gregor J. Martin, Mountain View, CA (US); Grant Lindberg, Pleasanton, CA (US)

(73) Assignee: LSI Corporation, Milpitas, CA (US)

( * ) Notice: Subject to any disclaimer, the term of this patent is extended or adjusted under 35 U.S.C. 154(b) by 269 days.

(21) Appl. No.: 11/204,669

(22) Filed: Aug. 16, 2005

(65) Prior Publication Data

US 2007/0044058 A1    Feb. 22, 2007

(51) Int. Cl.
*G06F 17/50* (2006.01)

(52) U.S. Cl. ............. 716/18; 716/1; 716/4; 716/11

(58) Field of Classification Search .......... 716/18, 716/1, 4, 11
See application file for complete search history.

(56) References Cited

U.S. PATENT DOCUMENTS 6,292,427 B1 *   9/2001   Roy ............... 365/230.03
2002/0073380 A1 *   6/2002   Cooke et al. ............... 716/1
2004/0128641 A1 *   7/2004   Broberg et al. ............ 716/18
2004/0145033 A1 *   7/2004   McElvain .................. 257/659
2005/0268268 A1 *   12/2005   Wang et al. ................ 716/9

* cited by examiner

*Primary Examiner*—Sun James Lin
(74) *Attorney, Agent, or Firm*—Christopher P. Maiorana, P.C.

(57) ABSTRACT

A design tool for generating design views of a semiconductor chip is presented. The design tool includes an input module, a generation module, a first synthesis module, a user interface module and an extraction module. The input module may be configured to receive input including physical and logical resources and a custom chip specification. The generation module may be configured to generate Register Transfer Level (RTL) views for the semiconductor chip. The first synthesis module may be configured to perform logic synthesis using the RTL views. The user interface module may be configured to query a user whether re-usable intellectual property (IP) is to be generated. The extraction module may be configured to extract and package design information for the re-usable IP in response to a request from the user.

20 Claims, 6 Drawing Sheets

ENABLING EFFICIENT DESIGN REUSE IN PLATFORM ASICS

FIELD OF THE INVENTION

The present invention relates to integrated circuit design generally and, more particularly, to a method and/or design tool for enabling efficient design reuse in platform/structured application specific integrated circuits (ASICs).

BACKGROUND OF THE INVENTION

In a conventional design flow, all customer designed logic is treated in the same way (i.e., the customer designed logic is operated on as raw RTL). The customer cannot package parts of the customer's design into re-usable intellectual property (IP). Subsequent customer designs that reuse logic from a prior customer design still require the entire customer designed logic to be entered into the design system from scratch. Conventional tools do not provide for re-use of the effort from an initial design, in subsequent designs. For example, if the customer has customer designed IP that is to be reused, each time the customer designed IP is reused, the customer has to go through all the stages of an implementation flow.

Re-running all of the stages of the implementation flow, on all logic for subsequent designs that share IP is inefficient, is time consuming and can be frustrating to the customer. Also, design-timing closure can be complicated and have a long run time during design placement and optimization.

It would be desirable to have a method and/or apparatus enabling efficient design reuse in platform/structured ASICs.

SUMMARY OF THE INVENTION

The present invention concerns a design tool for generating design views of a semiconductor chip comprising an input module, a generation module, a first synthesis module, a user interface module and an extraction module. The input module may be configured to receive input including physical and logical resources and a custom chip specification. The generation module may be configured to generate Register Transfer Level (RTL) views for the semiconductor chip. The first synthesis module may be configured to perform logic synthesis using the RTL views. The user interface module may be configured to query a user whether re-usable intellectual property (IP) is to be generated. The extraction module may be configured to extract and package design information for the re-usable IP in response to a request from the user.

The objects, features and advantages of the present invention include providing a method and/or design tool for enabling efficient design reuse in platform (or structured) application specific integrated circuits (platform/structured ASICs) that may (i) allow a customer to design IP once, (ii) re-use customer designed IP in subsequent designs, (iii) automatically extract information from customer design, (iv) generate soft, firm and/or hard IP, (v) store extract information with the IP and/or (v) automatically generate re-usable IP in response to customer input.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention generally relates to the efficiency of customers designing with platform (or structured) application specific integrated circuits (platform/structured ASICs). However, the present invention is not limited to application in platform/structured ASICs. The present invention may be used in other areas of design where re-use of previous design effort is important.

The present invention generally assists a modularized design methodology by allowing creation of customer defined soft intellectual property (IP), firm IP and/or hard IP. The present invention generally provides a feature that may be added to existing design tools. Customers may create their own collection of validated IP allowing quick reuse of the IP in subsequent designs.

Figure 1:
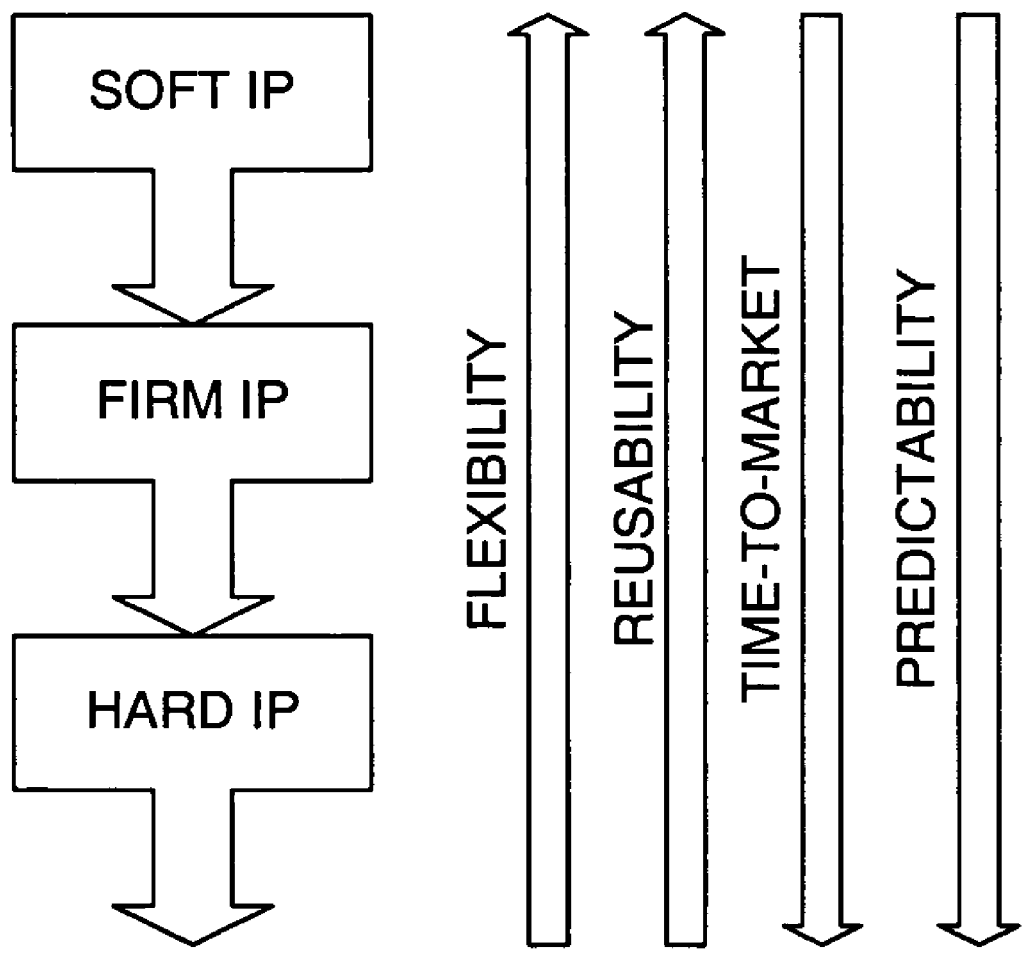
FIG. 1 is a diagram comparing various types of IP.

Referring to FIG. 1, a block diagram is shown comparing various types of intellectual property. The present invention generally involves three types of IP (or IP that may be reused at three stages of usability): soft IP, firm IP and hard IP. The term soft IP, as used herein, generally refers to synthesizable RTL (register transfer level) netlist with proper synthesis constraints, configuration options, operating frequency, area and power estimation, etc. The advantage of soft IP is its flexibility. Soft IP is compile time configurable and may be targeted to any technology platform.

The term firm IP, as used herein, generally refers to gate level netlist with proper synthesis constraints, relative placement constraints, and operation frequency and area report, as well as power estimation. In contrast to soft IP, firm IP is generally not compile time configurable and can only be targeted to selected technology. One advantage of firm IP is that the front-end optimization of the IP is completed and the user does not have to re-synthesize the IP. Not having to re-synthesize the IP saves design time. Another advantage of firm IP is that the frequency and area report for the firm IP is more accurate than the report for soft IP. For example, size and performance of soft IP may vary depending upon configuration, targeted technology, timing constraints and placement. In contrast to soft IP, firm IP is generated after physical synthesis with pre-defined configuration, technology and timing specifications. Because the configuration, technology and timing specifications are pre-defined, the area and performance report for firm IP is much more accurate than for soft IP.

The term hard IP, as used herein, generally refers to timing closed gate level netlist with placement, as well as routing constraints. Hard IP has fixed size and timing information and can only be targeted to selected technology. If the hard IP contains diffused IP, such as memory or SERDES (serializer/deserializer), the number of technology devices that may be chosen as a platform for the hard IP may be limited. One advantage of hard IP is that the optimization of the IP is complete for both front-end and back-end flows, which shortens the product development cycle. Another advantage is that the known architecture, performance and size of the hard IP make the design more predictable. In general, as IP moves from soft to hard embodiments, flexibility and reusability decrease while time-to-market and predictability increase.

Figures 2, 2A:
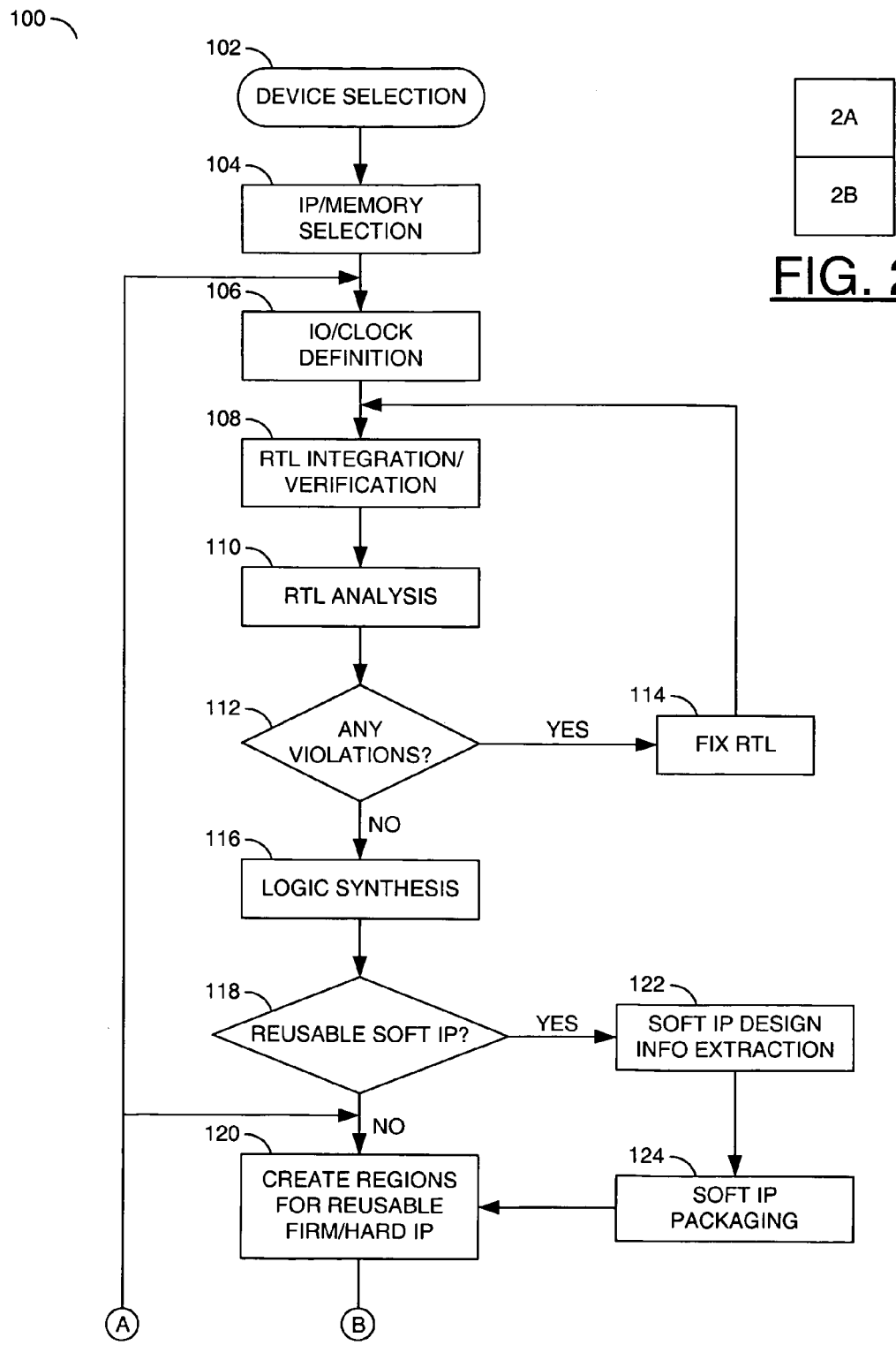
FIG. 2 is a flow diagram illustrating an example implementation flow in accordance with a preferred embodiment of the present invention.
Figure 2B:
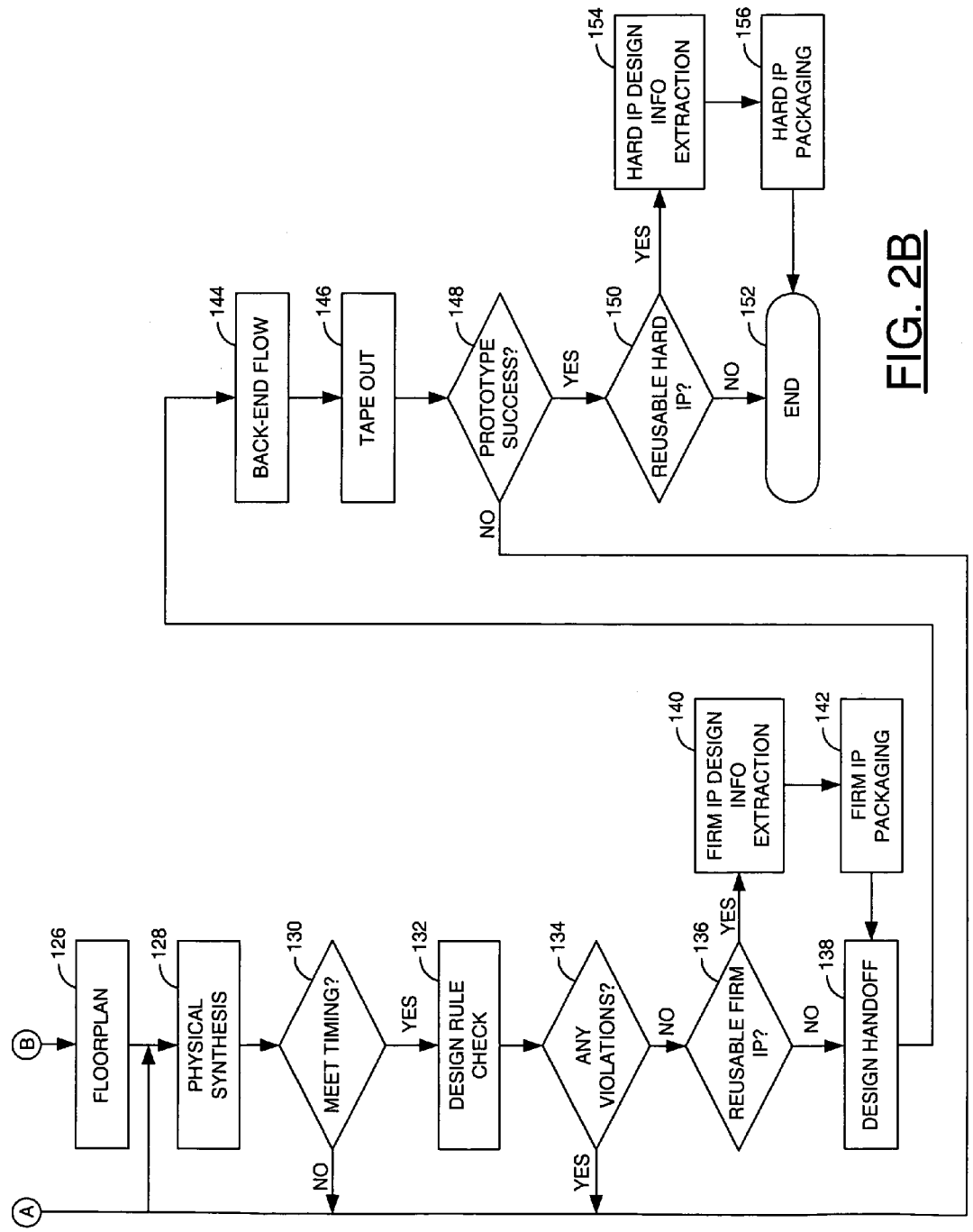

Referring to FIG. 2, a flow diagram is shown illustrating an example design implementation flow (or process) 100 in accordance with a preferred embodiment of the present invention. The process 100 may comprise a block (or module) 102, a block (or module) 104, a block (or module) 106, a block (or module) 108, a block (or module) 110, a decision block (or module) 112, a block (or module) 114, a block (or module) 116, a decision block (or module) 118, a block (or module) 120, a block (or module) 122, a block (or module) 124, a block (or module) 126, a block (or module) 128, a decision block (or module) 130, a block (or module) 132, a decision block (or module) 134, a decision block (or module) 136, a block (or module) 138, a block (or module) 140, a block (or module) 142, a block (or module) 144, a block (or module) 146, a decision block (or module) 148, a decision block (or module) 150, a block (or module) 152, a block (or module) 154 and a block (or module) 156. In the block 102, a device selection may be made to begin the process 100. In the block 104, specific IP and memory may be selected. In the block 106, I/O and clock definitions may be specified. In the block 108, RTL integration and verification is generally performed. In the block 110, RTL analysis is generally performed. In the block 112, the RTL analysis is examined to determine whether any violations have occurred. If violations have occurred, the process 100 generally moves to the block 114 where the RTL is fixed. Once the RTL is fixed, the process 100 generally returns to the block 108.

If no violations are detected, the process 100 generally moves to the block 116. In the block 116, logic synthesis of the design is performed. When the logic synthesis is complete, the process 100 generally moves to the block 118. In the block 118, the user may be queried whether reusable soft IP is to be generated. If no reusable soft IP is to be generated, the process 100 generally moves to the block 120. If reusable soft IP is to be generated, the process 100 generally moves to the block 122. In the block 122, a tool may be configured to extract soft IP design information. Once the soft IP design information is extracted, the process 100 moves to the block 124. In the block 124, the soft IP design information is packaged. When the soft IP is packaged, the process 100 generally moves to the block 120. In the block 120, regions for reusable firm and/or hard IP may be created (or identified) based upon user input.

From the block 120, the process 100 generally moves to a floor planning stage in the block 126. Following generation of a floorplan in the block 126, the process 100 generally moves to the block 128. In the block 128, a physical synthesis is performed. Once the physical synthesis is performed, the process 100 generally moves to the block 130. In the block 130, the result of the physical synthesis may be checked to determine whether timing constraints are met. If timing constraints have not been met, the process 100 generally returns to (i) the block 106 to refine the timing constraints or RTL and/or (ii) the block 120 to refine the floorplan. When the timing constraints are met, the process 100 generally moves to the block 132. In the block 132, the physical synthesis results are checked against the particular platform. For example, a gate level netlist design rule check (DRC) may be implemented to prevent problems that might occur in a subsequent back-end flow.

Once the physical synthesis gate level netlist has been checked against various design rules, the process 100 generally moves to the block 134. In the block 134, the gate level netlist analysis report may be examined to determine whether any violations have occurred. If violations have occurred, the process 100 generally returns to the block 106, the block 120 or the block 128 depending on the nature of the violation. When no violations have occurred, the process 100 generally moves to the block 136.

In the block 136, the user is asked (or queried) whether reusable firm IP is to be generated. If no reusable firm IP is to be generated, the process 100 generally moves to the block 138. When reusable firm IP is to be generated, the process 100 moves to the block 140. In the block 140, the firm IP design information is extracted. Once the firm IP design information has been extracted, the process 100 moves to the block 142. In the block 142, the firm IP information is packaged. Once the firm IP information has been packaged, the process 100 moves to the block 138. In the block 138, the process 100 generally gathers all design information to be used in a back-end design flow and creates a tar ball to hand off the design to the development center.

Once the front-end design hand-off has been completed, the process 100 generally moves to the block 144. In the block 144, the implementation flow is finished in the back-end flow. Once the implementation flow is finished, the process 100 generally moves to the block 146. In the block 146 tape out is performed. The back-end flow (e.g., performed by the development center) generally involves design routing, test insertion, clock tree synthesis, physical layout and final netlist verification (design rule checking, netlist versus layout checking, etc.), tapeout and chip prototype manufacturing. Tapeout generally refers to a final EBEAM for the design.

Following tape out, the process 100 moves to the block 148. In the block 148, a prototype is examined. If the prototype is not successful, the process. 100 generally returns to the block 106. When the prototype is successful, the process 100 generally moves to the block 150. In the block 150, the user is queried (or asked) whether reusable hard IP is to be generated. If no reusable hard IP is to be generated, the process 100 generally moves to an end block 152. If reusable hard IP is to be generated, the process 100 generally moves to the block 154. In the block 154, hard IP design information is extracted. Once the hard IP design information has been extracted, the process 100 moves to the block 156. In the block 156, the hard IP design information is packaged. Once the hard IP design information has been packaged, the process 100 generally moves to the end block 152.

In general, for soft IP, the user maps a design/sub-module to a virtual technology device during a block-level flow. If the design passes RTL rule checking and logical synthesis without any errors and/or congestion warnings, and the target frequency is achieved, the user is presented with the option of creating a soft core for the design block. In one example, the design tool may be configured to generate appropriate configuration information about the core in extensible mark-up language (XML) format. XML is an industry standard format that may be used for delivering design information. However, other standard and/or proprietary formats may be implemented to meet design criteria of a particular implementation. The soft core may be compile-time configurable if each combination of the configuration has been tested in the implementation flow. The advantage of the soft core is that the RTL is known to be good, and statistics about frequency, area, power, etc. may be captured and reused in a subsequent product, helping in both the planning stage and implementation stage. Also, constraints and other related data and settings may be captured and packaged (or bundled up) as part of the IP.

For firm IP, the user maps the design (or sub-module) to a chosen technology and device in the block-level flow. If the design passes RTL rule checking, physical synthesis with targeted frequency and has no error and/or congestion warnings, the tool may be configured to automatically create a firm core from the design. The tool generally creates a gate level netlist and relative placement constraints file. If the firm core interfaces to diffused IP, a list of recommended technology devices may be recorded in the auto-generated IP manifest. The firm IP deliverable generally includes the relative placement of cells, but not the routing information. In general, the front-end flow tools may define I/O, clock and memory, perform design rule checking against RTL and gate level netlist file, floorplan and physical synthesis to generate a timing-closed placed gate level netlist. The front-end floe is generally performed by the user.

With respect to hard IP, if a user has a timing-closed design/sub-module, the tool may be configured to automatically create a hard IP core from the module. Since hard IP generally contains the final timing-closed routing, the final IP is generally a product of the back-end flow, so cannot be generated entirely by the customer. However, the tool may be configured to allow the customer to highlight a specific core and request that the highlighted core be generated into a piece of hard IP.

In general, the different types of IP are generated at different stages of the design flow. The same IP may be delivered in all three formats (e.g., soft, firm and hard) to meet different design reuse criteria. The soft IP may be generated from a previous successful project flow or the user may map the design/sub-module to a virtual technology device during a block-level flow. If the design passes RTL rule checking and logical synthesis without any errors and congestion warnings, and the target frequency is achieved, then they have the option of creating a soft core for that design block. The soft core can be compile-time configurable if each combination of the configuration has been tested in the flow. As indicated in the flow illustrated in FIG. 2, the soft IP may be updated if a bug or timing violation fix is identified in a subsequent design flow. Allowing the soft IP to be updated guarantees the integrity of the soft IP. The tool may generate appropriate configuration information about the core in XML (or other) format. In one example, the design information captured and bundled as part of the soft IP package may include the following:

a) synthesizable RTL with different configuration options (if existing);
b) synthesis constraints;
c) estimated timing, size and power info;
d) interface signal information.

Similar to soft IP, the firm IP may be generated from a previous successful project flow or the user may map the design/sub-module to a virtual technology device during a block-level flow. The firm IP may be generated after physical synthesis with a time-closed gate level netlist file. If any bug fix affects the design block, the firm IP may be re-generated based on the updated design database. Ideally, the IP placement should be confined in a region to enhance the performance and design reusability. In one example, the design information captured and bundled as part of the firm IP package may include the following:

a) gate level netlist with relative placement constraints;
b) synthesis constraints;
c) estimated timing, size and power info;
d) interface signal information.

In contrast to soft and firm IP, which can be generated at the customer's site, hard IP can only be generated based on a successful prototype. Generation of the hard IP should be done by the manufacturer of the platform at the customer's request. In one example, the design information captured and bundled as part of the hard IP package may include the following:

a) a timing-closed gate level netlist with both placement and routing information;
b) an extracted timing model (ETM) of the IP;
c) an accurate timing, size and power report;
d) interface signal information.

Figure 3:
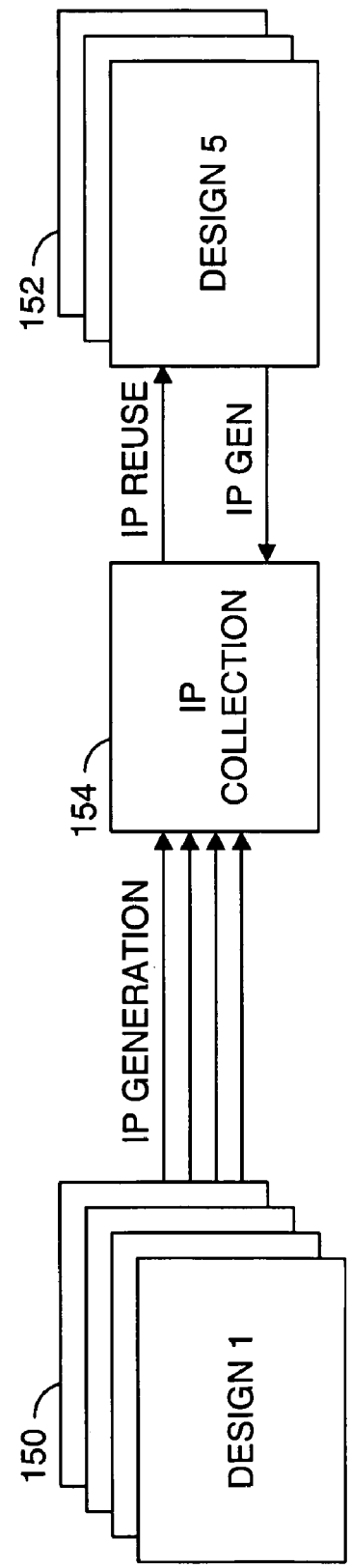
FIG. 3 is a block diagram illustrating an example IP collection in accordance with a preferred embodiment of the present invention.

Referring to FIG. 3, a block diagram is shown illustrating an example of an IP collection in accordance with a preferred embodiment of the present invention. As shown in FIG. 3, IP may be generated from one or more previous successful designs 150. The generated IP may be re-used in a next generation of design 152. The next generation of design 152 may also generate reusable IP. The reusable IP generated by the designs 150 and 152 may be added to a private (or customer) IP collection 154. The present invention generally provides an advantage by enabling private IP collections within a company. Another advantage is that IP related information and statistics about frequency, size, power, etc. may be captured and reused in a subsequent product. The present invention may help in both design planning stages and implementation stages. The present invention may especially benefit large companies with design groups across different geographic regions.

Figure 4A:
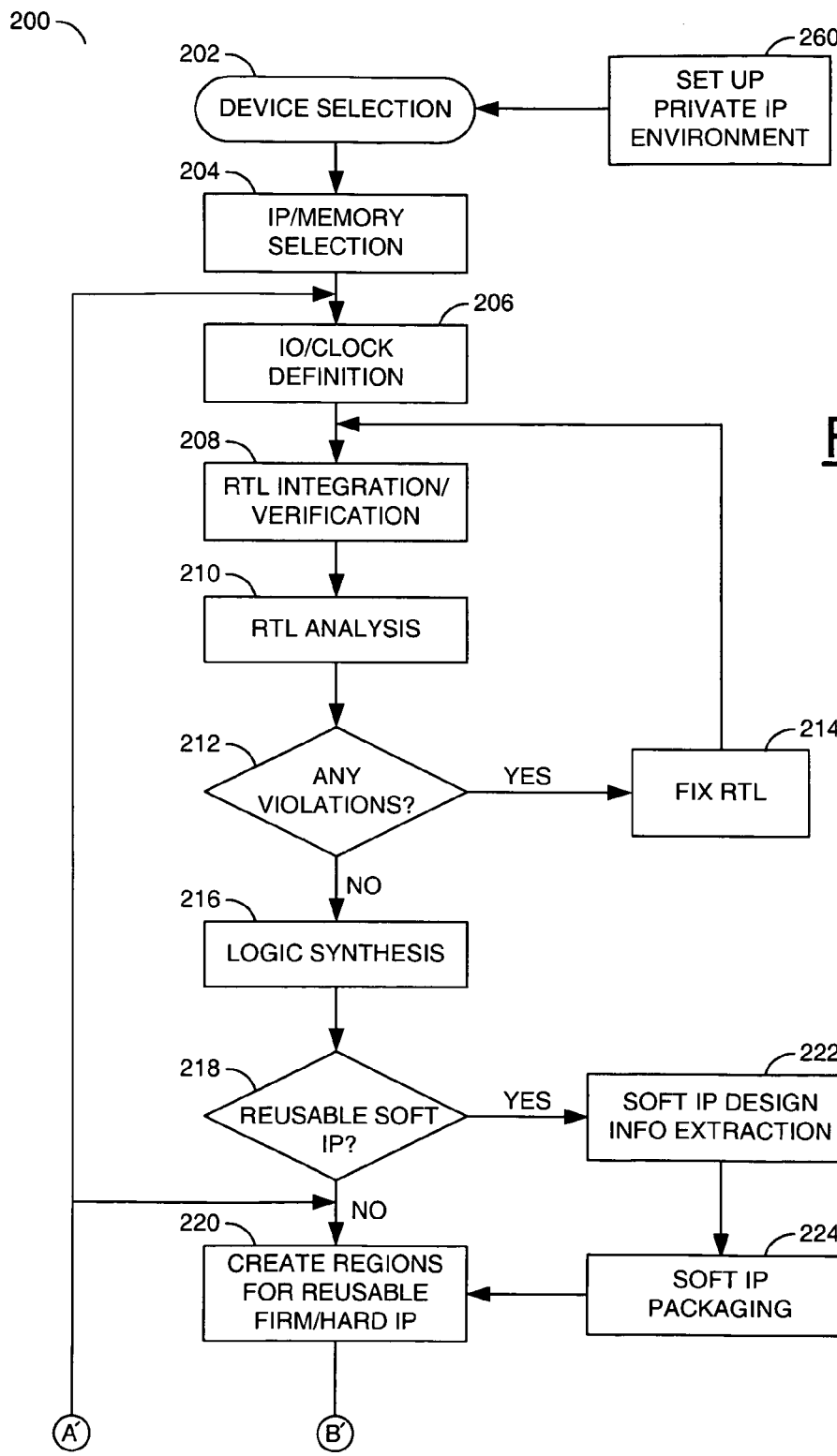
FIG. 4 is a flow diagram illustrating an example implementation flow using information generated in accordance with a preferred embodiment of the present invention.
Figure 4B:
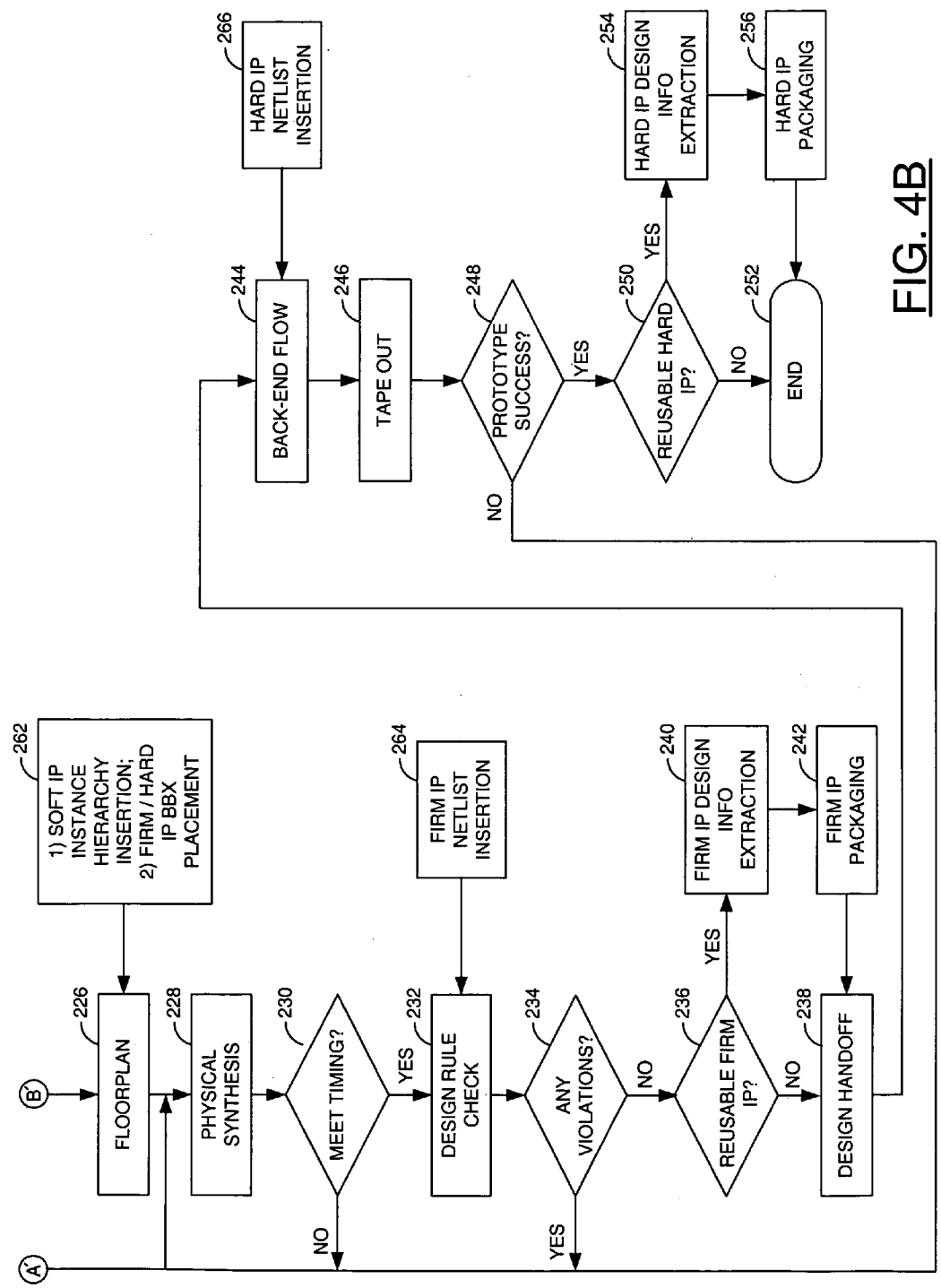

Referring to FIG. 4, a flow diagram is shown illustrating an example of an implementation flow 200 using information generated in accordance with a preferred embodiment of the present invention. The three types of IP generated in accordance with the present invention may be reused within the implementation design flow 200. The design flow 200 may comprise a number of blocks (or modules) 202-256. In one example, the blocks 202-256 may be implemented similarly to the corresponding blocks 102-156 in FIG. 2. In one embodiment, one or more of the blocks 212-224, 236, 240, 242, 248, 250, 254 and 256 may be omitted for previously generated reusable IP.

In one example, the design implementation flow 200 may further comprise a block (or module) 260, a block (or module) 262, a block (or module) 264 and a block (or module) 266. The block 260 may be implemented as a private IP environment setup block (or process). The block 262 may be implemented as a soft IP information input block (or process). The block 264 may be implemented as a firm IP insertion block (or process). The block 266 may be implemented as a hard IP insertion block (or process).

The block 260 may be configured to provide information regarding setup of a private IP environment of the design implementation flow 200. The design implementation flow 200 may be configured to use the customer (or private) IP by setting up, for example, a private IP environment variable with the information from the block 260 before invoking the flow tool. The private IP environment variable may configure the tool to load the IP from both an installation directory provided by the platform manufacturer and a user defined private IP directory. For example, the block 260 may provide an IP list describing available IP. In one example, the IP list may be implemented as follows:

Platform manufacturer's cores (provided by platform manufacturer):
GigaBlaze® (a trademark of LSI Logic Corporation), DDR2 PHY,
PCIE x16 Link.
3rd Party IP (provided by 3rd party IP vendor or platform manufacturer):
GDA PCIE x1 Link,
Denali DDR2 Memory Controller,
Private IP (e.g., internal IP, collected among different design groups of the customer):
EMAC,
DSP,
CAN.

The block 262 may be configured to provide IP information to the block 226 for floor planning. For soft IP, the information may include RTL, IP size and instance hierarchy, diffused IP and memory usage, etc. For firm and hard IP, the information may include IP placement information, region, size, diffused IP and memory usage, etc.

The block 264 may be configured to provide firm IP information to the block 232. The firm IP information may include placed gate level netlist. In general, the physical synthesis does not have to be re-run. However, in some cases the physical synthesis may be re-run to refine the timing. The block 264 may be configured to insert the firm IP information (e.g., netlist) into the placed design netlist to form a partially complete design netlist (e.g., only missing the hard IP netlist). The full design netlist may be checked against various design rules (e.g., the block 232). The block 266 may be configured to insert hard IP information (e.g., the netlist) to form a complete design netlist for the back-end flow (e.g., the block 244).

The advantage of the soft IP generated by the present invention is that the RTL of the soft IP is known to comply with any RTL coding guidelines of the platform. Therefore, the RTL analysis to the soft IP block is not necessary and the IP interface information provides enough information for the tool to continue with the rest of the design logic. Logic synthesis is also generally not necessary because the IP instance hierarchy structure may already be extracted during the IP generation step. Design run time may be saved, especially when dealing with large size IP blocks. In general, the soft IP is generally handled similarly to normal RTL starting with the physical synthesis step (e.g., block 128 in FIG. 2 or block 228 in FIG. 4).

The advantage of the firm IP generated by the present invention is that the RTL analysis and logic synthesis can be avoided. The advantage of the firm IP over the soft IP is that the user may avoid spending time and effort to run physical synthesis on the block and optimize the design block for area and performance. The firm IP may be black-boxed during physical synthesis and a netlist merge may occur after successful physical synthesis. However, the firm IP is generally not configurable and can only be targeted to a chosen technology.

The hard IP generated by the present invention is generally black-boxed throughout the front-end flow. The extracted timing model and interface information of the hard IP generally provides information for the tool to complete the floorplan. Users can experiment with placement of the hard IP to achieve full chip timing closure. If diffused IP is used in the hard IP, the number of devices and the placement of the hard IP may be limited. The hard IP netlist merge generally occurs at the back-end flow. In general, the hard IP netlist merge may be taken care of by a design center of the platform manufacturer.

The present invention generally allows a user to automatically create re-usable IP based on entry of their original design data into a design tool. Users may use the re-usable IP similarly to other IP that has been approved for use with a particular platform. The present invention also provides the user with the ability of highlighting a particular block of a design that is to be captured as a piece of hard IP.

In general, the present invention allows a customer to create their own IP once, and reuse the IP in subsequent designs. By automatically extracting the design data from the IP, a customer can easily use their IP in the same manner the customer would use manufacturer approved IP. For example, with a soft core, the tool may extract clock, constraint, power, gate count, memory information and any other appropriate information. The extracted information may be stored in an XML (or other) form that the tools can read in. In subsequent designs, the XML may be used to save time and reduce risk by helping to, automate the process of integrating the piece of IP.

The function(s) performed by the flow diagrams of FIGS. 2 and 4 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A design tool for generating design views of a semiconductor chip, the design tool comprising:
an input module configured to receive input comprising physical and logical resources and a custom chip specification;
an generation module configured to generate Register Transfer Level (RTL) views for said semiconductor chip;
a first synthesis module configured to perform logic synthesis using the RTL views;
a user interface module configured to query a user whether re-usable intellectual property (IP) is to be generated on said semiconductor chip; and
an extraction module configured to extract and package design information for the re-usable IP in response to a request from the user.

2. The design tool according to claim 1, wherein said re-usable IP comprises one or more types of IP selected from the group consisting of soft IP, firm IP and hard IP.

3. The design tool according to claim 1, wherein said re-usable IP comprises a synthesizable RTL netlist.

4. The design tool according to claim 1, wherein said re-usable IP comprises a gate level netlist.

5. The design tool according to claim 1, wherein said re-usable FR comprises a timing-closed gate level netlist with placement and routing constraints.

6. The design tool according to claim 1, wherein said design information for the re-usable IP comprises one or more types of information selected from the group consisting of netlists, synthesis constraints, configuration options, operating frequency, area estimation, power estimation, technology and platform constraints.

7. The design tool according to claim 1, further comprising:
a floorplan module configured to generate a floorplan view of said semiconductor chip; and
a second synthesis module configured to perform a physical synthesis for said semiconductor chip.

8. The design tool according to claim 7, wherein said floorplan module is configured to accept re-usable IP design information extracted from another custom design.

9. The design tool according to claim 1, wherein said extraction module is configured to package the design information for the re-usable IP using extensible mark-up language (XML).

10. The design tool according to claim 1, wherein said user interface is further configured to highlight a core for later generation into hard IP in response to input from the user.

11. A method for enabling reuse of design information from a design for a semiconductor chip comprising:
receiving input comprising physical and logical resources and a custom chip specification;
generating Register Transfer Level (RTL) views for said semiconductor chip;
generating a logic synthesis using the RTL views;
querying a user whether re-usable intellectual property (IP) is to be generated on said semiconductor chip; and
extracting and packaging design information for the re-usable IP in response to a request from the user.

12. The method according to claim 11, wherein said re-usable IP comprises one or more types of IP selected from the group consisting of soft IP, firm IP and hard IP.

13. The method according to claim 11, wherein said re-usable IP comprises a synthesizable RTL netlist.

14. The method according to claim 11, wherein said re-usable IP comprises a gate level netlist.

15. The method according to claim 11, wherein said re-usable IP comprises a timing-closed gate level netlist with placement and routing constraints.

16. The method according to claim 11, wherein said design information for the re-usable IP comprises one or more types of information selected from the group consisting of netlists, synthesis constraints, configuration options, operating frequency, area estimation, power estimation, interface signals, technology and platform constraints.

17. The method according to claim 11, further comprising:
generating a floorplan view of said semiconductor chip; and
generating a physical synthesis of said semiconductor chip.

18. The method according to claim 17, wherein the generating of said floorplan view comprises re-using IP design information extracted from another custom design.

19. The method according to claim 11, further comprising highlighting a core for later generation into hard IP in response to input from the user.

20. A computer readable medium having instructions for causing a computer to execute a method for designing a semiconductor chip comprising:
receiving input comprising physical and logical resources and a custom chip specification;
generating Register Transfer Level (RTL) views for said semiconductor chip;
generating a logic synthesis using the RTL views;
querying a user whether re-usable intellectual property (IP) is to be generated on said semiconductor chip; and
extracting and packaging design information for the re-usable IP in response to a request from the user.

* * * * *